United States Patent
Peeters et al.

(10) Patent No.: US 6,417,243 B1
(45) Date of Patent: Jul. 9, 2002

(54) MONOMERS, OLIGOMERS AND POLYMERS COMPRISING TERMINAL OXIRANE GROUPS, THEIR PROCESS OF PREPARATION AND THEIR CATIONIC POLYMERIZATION UNDER IRRADIATION

(75) Inventors: Stephan Peeters, Heverlee; Kris Verschueren, Groot-Bijgaarden; Jean-Marie Loutz, Brussels, all of (BE)

(73) Assignee: UCB, S.A., Brussels (BE)

( * ) Notice: Subject to any disclaimer, the term of this patent is extended or adjusted under 35 U.S.C. 154(b) by 0 days.

(21) Appl. No.: 09/628,691

(22) Filed: Jul. 28, 2000

Related U.S. Application Data

(63) Continuation of application No. 09/269,480, filed as application No. PCT/EP97/05303 on Sep. 27, 1997.

(30) Foreign Application Priority Data

Sep. 30, 1996 (BE) .............................. 9600821

(51) Int. Cl.[7] .............................. C08J 3/28; C08L 63/00; C08G 59/12
(52) U.S. Cl. .............................. 522/31; 522/32; 522/66; 522/142; 522/162; 522/164; 522/166; 522/170; 522/172; 522/173; 522/179; 528/25; 528/26; 528/65; 528/297; 528/307; 528/421
(58) Field of Search .............................. 522/148, 162, 522/164, 166, 170, 31, 32, 66, 173, 179, 172; 528/288, 297, 307, 272, 406, 409, 421

(56) References Cited

U.S. PATENT DOCUMENTS

| | | | |
|---|---|---|---|
| 3,624,180 A | 11/1971 | Schmid | |
| 4,038,338 A | 7/1977 | Baumann | |
| 5,354,791 A | 10/1994 | Gallucci | |

FOREIGN PATENT DOCUMENTS

| | | |
|---|---|---|
| EP | 0139042 | 12/1983 |
| EP | 0221559 | 11/1986 |
| EP | 0262414 | 8/1987 |
| EP | 0467258 | 7/1991 |

*Primary Examiner*—Susan W. Berman
(74) *Attorney, Agent, or Firm*—Finnegan, Henderson, Farabow, Garrett & Dunner L.L.P.

(57) ABSTRACT

In order to offer coatings with improved resistance to solvents which can be prepared by cationic polymerization under irradiation, the choice is made of a composition comprising at least one monomer, oligomer or polymer of general formula (I):

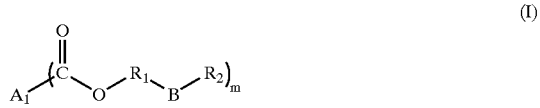

in which:

$A_1$ is chosen from polyester blocks, polyurethane blocks, hydrocarbon-comprising backbones of mono- or polycarboxylic acid and addition products of a polycarboxylic acid and of a cycloaliphatic diepoxide, m is a number from 1 to 6, $R_1$ is a cycloaliphatic group carrying a hydroxyl group situated in the a position with respect to the oxygen atom to which $R_1$ is bonded, $R_2$ is a second cycloaliphatic group carrying an oxirane group situated at the chain end, and B is chosen from one or more covalent bonds, an oxygen atom and linear, branched or cyclic hydrocarbon-comprising radicals.

32 Claims, No Drawings

MONOMERS, OLIGOMERS AND POLYMERS COMPRISING TERMINAL OXIRANE GROUPS, THEIR PROCESS OF PREPARATION AND THEIR CATIONIC POLYMERIZATION UNDER IRRADIATION

This is a continuation of application Ser. No. 09/269,480, filed Mar. 29, 1999, which is a 371 of PCT/EP97/05303 filed Sep. 27, 1997 which is incorporated herein by reference.

The present invention relates to novel monomers, oligomers and polymers carrying cycloaliphatic epoxy functional groups capable of being polymerized under irradiation and to coatings exhibiting, by comparison with cationically polymerizable systems known to date, an improved resistance to solvents which are obtained by cationic polymerization of compositions comprising the said monomers, oligomers and polymers carrying cycloaliphatic epoxy functional groups.

The coatings industry is continually on the lookout for materials exhibiting an improved resistance to chemical attacks and in particular to solvents, detergents, cleaners, pickling agents and other substances capable of attacking the surfaces and of modifying the essential qualities thereof of colour, of durability, of porosity, and the like. Furthermore, this same industry is also on the lookout for materials which, while possessing the improved resistance expressed above, are polymerizable in the form of a coating, as a thin or thick layer, while having recourse either to thermal curing or to one of the irradiation techniques, such as ultraviolet radiation or ionizing radiation, such as gamma rays, X-rays or an electron beam. This is because these techniques have acquired, in the industry, a well-established reputation for reliability and productivity by virtue of the high rates of polymerization which they make it possible to achieve and of the consistency of the coating characteristics thus obtained.

Coatings have already been obtained by polymerization of compositions comprising oligomers and polymers, in particular polyesters and polyethers, carrying cycloaliphatic epoxy functional groups. Thus, U.S. Pat. No. 3,968,135 discloses the catalytic promotion of the reaction of compounds comprising oxirane groups with organic carboxylic compounds by means of a chromium(III) tricarboxylate compound possessing available coordination sites in the presence of a solvent system comprising a neutral solvent and a coordinating solvent. This process is applied to the reaction either of a monoepoxy compound with a di- or polycarboxylic acid or of a diepoxide with a monoacid. In particular, this document discloses that the epoxide can be epoxidized dicyclohexenecarboxylate and that the polyfunctional acid can be a polyester or polyether comprising carboxyl endings. However, the molar ratio between the compounds to be reacted is such that all the acidic functional groups available lead to the immediate and complete crosslinking of the material obtained. Thus, the examples in this document more specifically describe triepoxide/diacid and triacid/diepoxide systems capable of crosslinking at 75° C. in only 15 minutes. These systems can be used, in the form of solutions or of emulsions, as coating compositions. No mention is made in this document of a cationic photo-initiator.

However, for a number of applicational niches, these polymers do not offer the complete compromise of desired properties. For these applications, moreover, it would be desired to have available compositions based on polyacrylates, on polyurethanes or on one or other of the monomers forming part of these polymers. Finally, for all these compositions starting from different base polymers, a satisfactory ability to polymerize under irradiation, in particular by the effect of ultraviolet radiation or of ionizing radiation, under current industrial conditions would be desired.

In order to solve the problems set out above, the present invention provides a novel category of monomers, oligomers and polymers chosen from those of general formula (I):

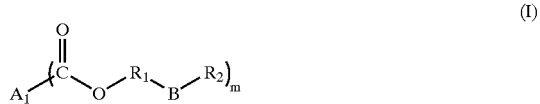

(I)

in which:
A$_1$ is chosen from polyester blocks having a molecular weight of between 250 and 10,000 approximately, polyurethane blocks having a molecular weight of between 500 and 5000 approximately, hydrocarbon-comprising backbones of a mono- or polycarboxylic acid and addition products of a polycarboxylic acid and of a cycloaliphatic diepoxide, the said addition products preferably being obtained by reaction of x mol of cycloaliphatic diepoxide with x+2 mol of dicarboxylic acid, m is a number from 1 to 6, R$_1$ is a cycloaliphatic group carrying a hydroxyl group situated in the α position with respect to the oxygen atom to which R$_1$ is bonded which, if appropriate, carries substituent(s), R$_2$ is a second cycloaliphatic group carrying an oxirane group situated at the chain end which, if appropriate, carries substituent(s), and B is chosen from one or more covalent bonds, an oxygen atom and linear, branched or cyclic hydrocarbon-comprising radicals carrying, if appropriate, oxygen and/or silicon atoms, and those of general formula (II):

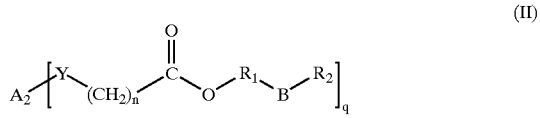

(II)

in which:
A$_2$ is a block chosen from homopolymers and copolymers of at least one vinyl monomer, n is an integer from 0 to 15 approximately, with the condition that n is at least equal to 1 when Y is sulphur, and Y is chosen from a sulphur atom, —CR'R" radicals, in which R' and R" are each an aliphatic group having from 1 to 4 carbon atoms, and their mixtures, q is an integer or non-integer ranging from 1 to 2, R$_1$, B and R$_2$ are defined as in the above formula (I).

In order for the invention to be fully understood, each of the terms R$_1$, R$_2$, A$_1$, A$_2$ and B will now be defined in more detail.

R$_1$ and R$_2$ are cycloaliphatic groups with a ring preferably having 5 to 6 members which can carry one or more substituents, preferably hydrocarbon-comprising substituents, which are preferably not very sterically hindered. Examples of such substituents comprise alkyl radicals having from 1 to 9 carbon atoms, such as methyl, ethyl, n-propyl, n-butyl, n-hexyl, 2-ethylhexyl, n-octyl and n-nonyl. These cycloaliphatic groups $R_1$ and $R_2$ necessarily carry, in addition, one ($R_1$) a hydroxyl group at the a position with respect to the oxygen atom to which $R_1$ is bonded and the other ($R_2$) an oxirane group situated at the end of the cyclic chain.

The cycloaliphatic groups $R_1$ and $R_2$ are connected to one another by a component B which can be an oxygen atom or else one or more, preferably one or two, covalent bonds, for example as in the following formulae:

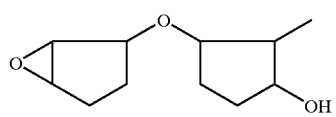
(III)

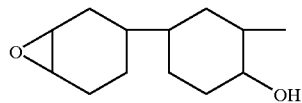
(IV)

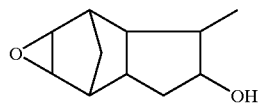
(V)

The component B can also consist of a linear, branched or cyclic hydrocarbon-comprising radical which can comprise one or more oxygen and/or silicon atoms in the carbon-comprising chain. Mention may be made, as examples of such B radicals, of:

—(CH$_2$)$_n$— alkylene groups in which n is an integer from 1 to 12 approximately, a —CH=CH— group a group of formula

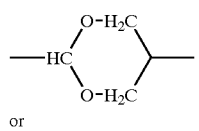
(VI)

or

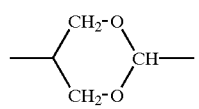
(VII)

a group of formula

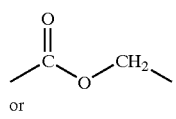
(VIII)

or

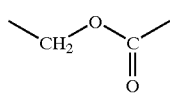
(IX)

a group of formula (X)

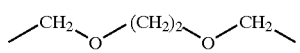
(X)

a group of formula (XI)

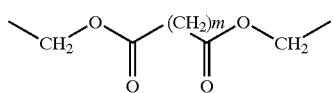
(XI)

in which m is an integer from 0 to 20 approximately, preferably from 1 to 6, a group of formula (XII)

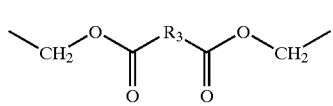
(XII)

in which $R_3$ is a cycloaliphatic radical, such as 1,4-cyclohexane, 1,3-cyclohexane, 1,2-cyclohexane and the like, it being possible for the said cyclic radical, if appropriate, to carry an oxirane group a group of formula (XIII)

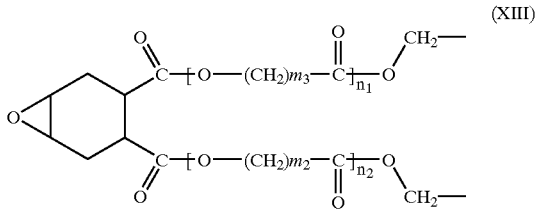
(XIII)

in which $m_1$ and $m_2$ are each an integer from 1 to 6 approximately and $n_1$ and $n_2$ are each an integer from 0 to 2 a group of formula (XIV)

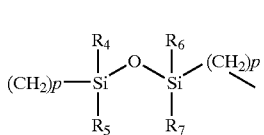
(XIV)

in which p is an integer from 1 to 10 approximately, preferably from 1 to 3, and $R_4$, $R_5$, $R_6$ and $R_7$ are each chosen independently from alkyl radicals having from 1 to 4 carbon atoms, preferably the methyl radical, a group of formula (XV)

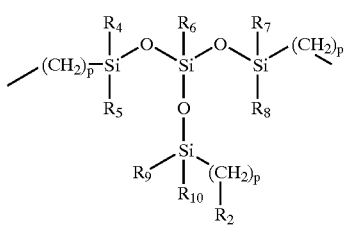

(XV)

in which p is an integer from 1 to 10 approximately, preferably from 1 to 3, $R_4$, $R_5$, $R_7$, $R_8$, $R_9$ and $R_{10}$ are each chosen independently from alkyl radicals having from 1 to 4 carbon atoms, preferably the methyl radical, $R_6$ is chosen from alkyl radicals having from 1 to 4 carbon atoms, preferably the methyl radical, and aryl radicals having from 6 to 9 carbon atoms, preferably the phenyl radical, and $R_2$ has the same meaning as in the above formula (I)

a group of formula (XVI)

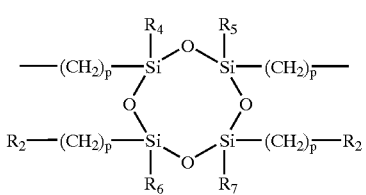

(XVI)

in which $R_4$, $R_5$, $R_6$ and $R_7$ are each chosen independently from alkyl radicals having from 1 to 4 carbon atoms, preferably the methyl radical, p is an integer from 1 to 20 approximately, preferably from 1 to 6, and $R_2$ has the same meaning as in the above formula (I).

As indicated above, $A_1$ can be the hydrocarbon-comprising backbone of a mono- or polycarboxylic acid preferably chosen from saturated aliphatic monoacids, such as lauric acid or stearic acid, or unsaturated aliphatic monoacids, such as oleic acid, saturated or unsaturated aliphatic diacids having from 4 to 40 carbon atoms approximately, such as maleic acid, fumaric acid, succinic acid, adipic acid, glutaric acid, azelaic acid, decanedicarboxylic acid and 1,4-cyclohexanedicarboxylic acid, and dimer acids, aromatic diacids, such as terephthalic acid and isophthalic acid, and tricarboxylic acids, such as citric acid and trimer acids which can comprise up to 60 carbon atoms.

$A_1$ can alternatively be a polyester block with a molecular weight of between 250 and 10,000 approximately, preferably between 1000 and 5000, resulting from the polycondensation of at least one aliphatic or aromatic dicarboxylic acid or the corresponding anhydride and of at least one polyol. This polyol can be a tri-, tetra-, penta- or hexahydroxylated glycol or polyol, such as ethylene glycol, diethylene glycol, propylene glycol, 1,4-butanediol, 1,6-hexanediol, trimethylolpropane, ditrimethylolpropane, trimethylolethane, pentaerythritol, dipentaerythritol and 1,3, 5-tris(2-hydroxyethyl)-1,3,5-triazine-2,4,6(1H, 3H, 5H)-trione (or tris(2-hydroxyethyl)-isocyanuric acid). It can also be a cycloaliphatic diol, such as 2,2-bis(4-hydroxycyclohexyl)propane (or hydrogenated bisphenol A), 1,4-cyclohexanedimethanol, 1,4-cyclohexanediol, 2,2,4,4-tetramethyl-1,3-cyclobutanediol or 4,8-bis(hydroxymethyl) tricyclo[5.2.1.0$^{2,6}$]decane (or tricyclodecanedimethanol).

Mention may be made, as dicarboxylic acid (or corresponding anhydride) which can be used in the formation of this polyester, of succinic acid, glutaric acid, adipic acid, pimelic acid, isophthalic acid, terephthalic acid and 1,4,5,6,7,7-hexachloro-5-norbornene-2,3-dicarboxylic acid, succinic anhydride, maleic anhydride and trimellitic and tetrachlorophthalic anhydrides.

Finally, $A_1$ can be a polyurethane block with a molecular weight of between 500 and 5000 approximately, preferably between 1500 and 4000, resulting from the polycondensation of at least one organic polyisocyanate and of at least one polyhydroxylated acid. Mention may be made, as example of such an acid, of dihydroxymethyl-propionic acid. In addition, it is possible to employ, for this polycondensation, a polyol such as that used for the formation of the polyester described above.

Mention may be made, as organic polyisocyanates which can be used in the formation of this polyurethane, of compounds comprising at least two isocyanate functional groups per molecule, such as an aliphatic, cycloaliphatic or aromatic diisocyanate. Mention may be made, as examples of appropriate aliphatic diisocyanates, of 1,4-diisocyanatobutane, 1,6-diisocyanatohexane, 1,6-diisocyanato-2,2,4-trimethylhexane and 1,12-diisocyanatododecane. Cycloaliphatic diisocyanates which are particularly appropriate comprise 1,3-diisocyanatocyclohexane, 1,4-diisocyanatocyclohexane, 2,4-diisocyanato-1-methylcyclohexane, 1,3-diisocyanato-2-methylcyclohexane, 1-isocyanato-2-(isocyanatomethyl) cyclopentane, 1,1'-methylenebis[4-isocyanatocyclohexane], 1,1'-(1-methylethylidene)bis[4-isocyanatocyclohexane], 5-isocyanato-1-isocyanatomethyl-1,3,3-trimethylcyclohexane(isophorone diisocyanate), 1,3- and 1,4-bis(isocyanatomethyl)cyclohexane, 1,1'-methylenebis [4-isocyanato-3-methylcyclohexane] and 1-isocyanato-4(or 3)-isocyanatomethyl-1-methylcyclohexane. Aromatic diisocyanates which are particularly appropriate comprise 1,4-diisocyanatobenzene, 1,1'-methylenebis[4-isocyanatobenzene], 2,4-diisocyanato-1-methylbenzene, 1,3-diisocyanato-2-methylbenzene, 1,5-diisocyanatonaphthalene, 1,1'-(1-methylethylidene)bis[4-isocyanatobenzene) and 1,3- and 1,4-bis(1-isocyanato-1-methylethyl)benzene. Aromatic or aliphatic polyisocyanates comprising 3 or more isocyanate groups can also be used, such as, for example, 1,1', 1'-methylidynetris[4-isocyanatobenzene], the trimer of hexamethylene diisocyanate and the polyphenylpolymethylene polyisocyanates obtained by phosgenation of aniline/formaldehyde condensates. The total amount of organic polyisocyanate can be from 10 to 60% by weight of the polyurethane in the $A_1$ block.

As indicated above, $A_2$ is a polymer block comprising at least repeat units originating from at least one vinyl monomer, in particular from acrylic or methacrylic esters. This block can be a homopolymer of such an ester or else a copolymer, generally a random copolymer, of several such esters or alternatively a copolymer of at least one (meth) acrylic ester and of one (or more) vinylaromatic monomer(s) copolymerizable with the said (meth)acrylic ester. Mention may be made, as acrylic and methacrylic esters which can take part in the composition of the $A_2$ block, of acrylates and methacrylates having from 1 to 20 carbon atoms approximately in the ester radical, such as methyl, ethyl, isopropyl, n-propyl, isobutyl, n-butyl, tert-butyl, 2-ethylhexyl and n-octyl acrylates, as well as n-pentyl, n-hexyl, n-octyl, n-dodecyl, n-tetradecyl, isobornyl, methyl and ethyl methacrylates and hydroxylated (meth)acrylates, such as hydroxyethyl or hydroxypropyl (meth)acrylates. Mention may be made, as other vinyl monomers which can take part in the composition of the $A_2$ block, mainly of (meth) acrylamides, vinylaromatic monomers, such as styrene, vinyltoluene, a-methylstyrene and similar substituted styrenes (in particular substituted. by one or more halogen atoms), and, moreover, vinyl acetate.

According to another aspect, the present invention also relates to a process for the preparation of the monomers, oligomers and polymers of formulae (I) and (II) comprising the reaction of a monomer or polymer compound of general formula (XVII)

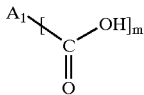
(XVII)

in which $A_1$ and m are as defined in the formula (I) (for the purpose of obtaining the compounds of formula I), or also of general formula (XVIII)

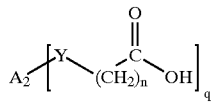
(XVIII)

in which $A_2$, Y, q and n are as defined in the formula (II) (for the purpose of obtaining the compounds of formula II), with a cycloaliphatic diepoxide of general formula (XIX)

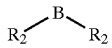
(XIX)

in which B and $R_2$ are as defined in the formulae (I) and (II), the molar ratio of the diepoxide (XIX) to the monomer or polymer of formula (XVII) or (XVIII) being such that at least one epoxide functional group of the compound (XIX) remains available for another possible subsequent reaction.

The distinctive feature of the process according to the invention lies in the fact that, in contrast in particular to the teaching of U.S. Pat. No. 3,968,135, the reaction conditions are chosen so that the reaction with the carboxylic acid functional group(s) present in the monomer or polymer (XVII) or (XVIII) results in products being obtained which comprise at least one cycloaliphatic epoxy functional group. More particularly, it is preferable to use at least 2 epoxy equivalents per 1 carboxylic acid equivalent.

The compounds of formula (XVII) are chosen from:
  mono- or polycarboxylic acids for which $A_1$ constitutes the hydrocarbon-comprising backbone and several examples of which have been mentioned above on the occasion of the definition of $A_1$.
  polyesters comprising carboxyl endings for which $A_1$ constitutes the polyester block and several examples of which have been mentioned above on the occasion of the definition of $A_1$. Their preparation is well known to a person skilled in the art and their acid number generally varies from 5 to 450 mg KOH/g approximately.
  polyurethanes comprising a carboxyl functional group for which $A_1$ constitutes the.central block, several examples of which have been mentioned above on the occasion of the definition of $A_1$ and the preparation of which is well known to a person skilled in the art.

The compounds of formula (XVIII) are, in a way well known to a person skilled in the art, obtained by radical homopolymerization or copolymerization of at least one acrylic. or methacrylic ester and, if appropriate, of at least one vinylaromatic monomer in the presence of at least one free radical initiator of organic peroxide type (such as benzoyl peroxide) or diazo compound type, such as 2,2'-azobis(2-methylbutyronitrile), and of at least one chain-transfer agent comprising a carboxylic acid functional group or else in the presence of an initiator of diazo type comprising a carboxylic acid functional group, such as 4,4'-azobis(4-cyanovaleric acid) or else these two compounds used in combination. Mention may be made, as examples of chain-transfer agents, of mercaptocarboxylic acids having from 2 to 16 carbon atoms, such as mercaptoacetic acid, 2-mercapto and 3-mercaptopropionic acids, 2-mercaptobenzoic acids, mercaptosuccinic acid, mercaptoisophthalic acid and the like. A person skilled in the art is fully aware of how to adjust the molecular weight of the polymers of formula (XVIII) by the choice, in nature and in amount, of the free radical initiator and of the chain-transfer agent as well as of the polymerization conditions, in particular the polymerization temperature. For the implementation of the present invention, it. is preferable generally to choose polymers (XVIII) with a molecular weight ranging from 5000 to 20,000 approximately.

The compounds of formula (XIX) employed in the process according to the invention are well known to a person skilled in the art and can be chosen in particular from:
  diepoxides of cycloaliphatic esters of dicarboxylic acids, such as those of formula (XX)

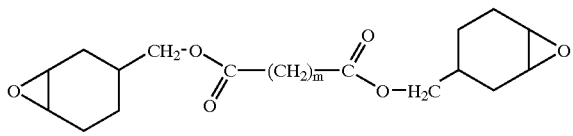
(XX)

in which m is an integer from 0 to 20 approximately, preferably from 1 to 6, and each of the carbon atoms of the aliphatic rings can carry one or two substituents, preferably hydrocarbon-comprising substituents, which are preferably not very sterically hindered, such as linear alkyl radicals having from 1 to 9 carbon atoms approximately. Specific examples of such diepoxides of formula (XX) are bis(3,4-epoxycyclohexylmethyl)oxalate, bis(3,4-epoxycyclohexylmethyl)adipate bis(3,4-epoxy-6-methylcyclohexylmethyl)adipate and bis(3,4-epoxycyclohexylmethyl)pimelate.

3,4-epoxycyclohexylmethyl 3,4-epoxycyclohexanecarboxylates of formula (XXI)

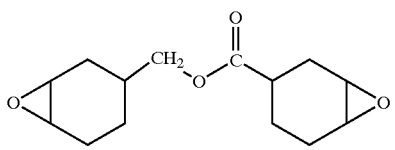
(XXI)

in which each of the carbon atoms of the aliphatic rings can carry one or two substituents, preferably hydrocarbon-comprising substituents, which are preferably not very sterically hindered, such as linear alkyl radicals having from 1 to 9 carbon atoms. Specific examples of such diepoxides of formula (XXI) are 3,4-epoxycyclohexylmethyl 3,4-epoxycyclohexane carboxylate, 3,4-epoxy-1-methyl-cyclohexylmethyl-3,4-epoxy-1-methylcyclohexane carboxylate, 6-methyl-3,4-epoxycyclohexylmethyl 6-methyl-3,4-epoxycyclohexane carboxylate, 3,4-epoxy-3-methylcyclohexyl-methyl-3,4-epoxy-3-methylcyclohexane carboxylate and 3,4-epoxy-5-methylcyclohexyl-methyl-3,4-epoxy-5-methyl-cyclohexane carboxylate.

diepoxides of formula (XXII)

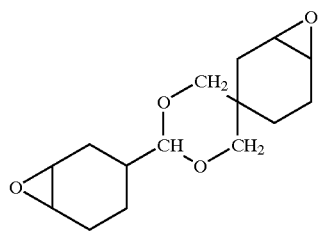
(XXII)

in which each of the carbon atoms of the aliphatic rings can carry one or two substituents which are preferably not very sterically hindered, such as linear alkyl radicals having from 1 to 9 carbon atoms approximately or halogen atoms.

1,2,5,6-diepoxy-4,7-methanoperhydroindene of formula (XXIII)

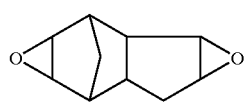
(XXIII)

2-(3,4-epoxycyclohexyl)-3',4'-epoxy-1,3-dioxane-5-spirocyclohexane of formula

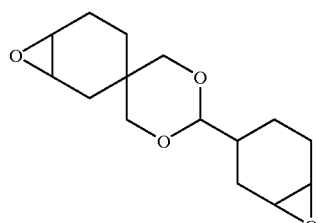
(XXIV)

1,2-ethylenedioxybis(3,4-epoxycyclohexylmethane) of formula

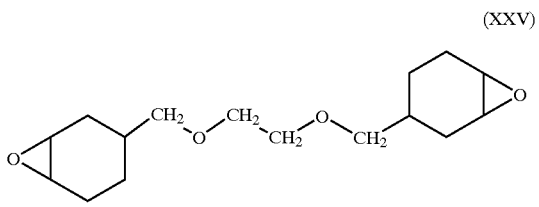
(XXV)

di(2,3-epoxycyclopentyl) ether of formula (XXVI)

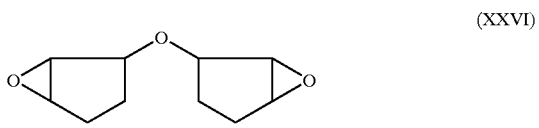
(XXVI)

the diepoxycyclohexanes of formulae

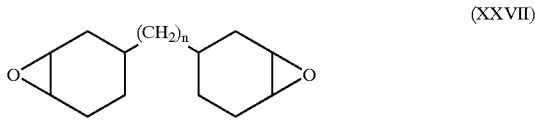
(XXVII)

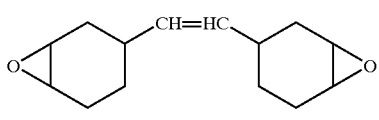
(XXVIII)

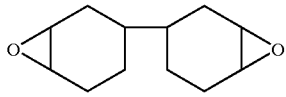
(XXIX)

the silicon-carrying diepoxycyclohexanes of formulae

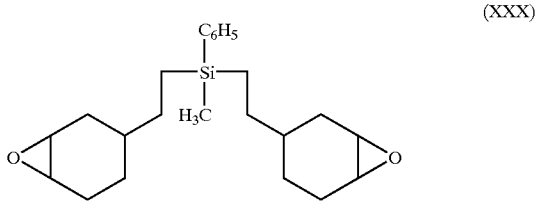
(XXX)

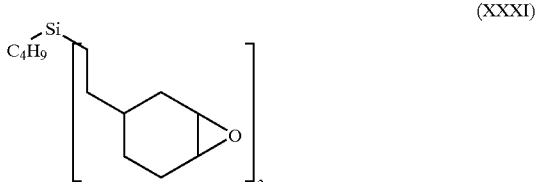
(XXXI)

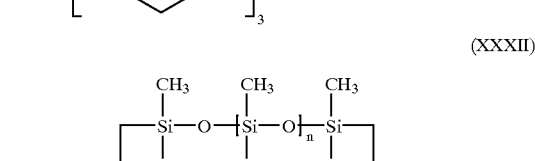
(XXXII)

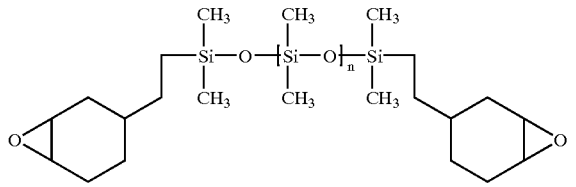

in which n is an integer from 0 to 10 approximately

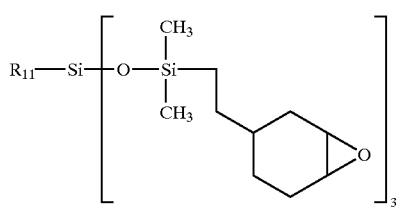

(XXXIII)

in which $R_{11}$ is chosen from alkyl radicals having from 1 to 8 carbon atoms (in particular the methyl group) and aryl radicals having from 6 to 9 carbon atoms (in particular the phenyl group), and

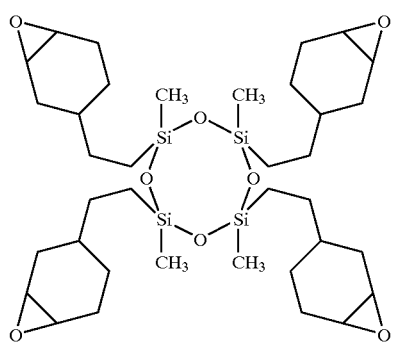

(XXXIV)

The compounds of formulae (XXX) to (XXXIV) can be prepared in particular according to the teaching of J. V. Crivello and J. L. Lee, *J. Polym. Sci.*, Poly. Chem., 1990, Vol. 28, 479–503 and J. V. Crivello, *Adv. in Polym. Sci.*, 1984, 62, 1.

The reaction of the process according to the invention for the preparation of the compounds of formulae (I) and (II) is preferably carried out in the presence of at least one solvent and with application of heat. The choice will preferably be made as solvent of a compound capable of providing good salvation of the carboxyl group present in the compounds of formulae (XVII) and (XVIII). Mention will be made, by way of example, of aromatic hydrocarbons, such as toluene and xylene. The reaction temperature will naturally be chosen as a function of the boiling temperature of the solvent used and will generally be within a range from 100° C. to 150° C. approximately. The degree of progression of the reaction can be monitored by any known means, such as, in particular, the measurement of the acid number of the reaction mixture. The reaction is generally regarded as complete when this number becomes less than or equal to 5 mg KOH/g.

The reaction of the process according to the invention can, if desired, be accelerated by the presence of a catalytic amount of a compound known to facilitate and promote the reaction between the epoxide functional group and the carboxylic acid functional group. Mention may be made, as such compounds, on the one hand, of catalysts based on a transition metal, such as chromium, for example trivalent chromium chloride or a trivalent chromium tricarboxylate, if appropriate diluted in one or more esters of phthalic acid and of alcohols having from 6 to 20 carbon atoms approximately. Mention may particularly be made, as chromium(III) tricarboxylate, of the butyrate, pentanoate, hexanoate, 2-ethylhexanoate, decanoate, oleate, stearate, tolerate, cresylate, benzoate, alkylbenzoates, alkoxybenzoates and naphthenates. Mention may also be made, as catalyst, of quaternary ammonium halides, such as benzyltrimethylammonium chloride, or ferric chloride. Catalytic amount is generally understood to mean the use of a proportion ranging up to approximately 0.2% by weight of this promoter with respect to the sum of the monomer or polymer of formula (XVII) or (XVIII) and of the cycloaliphatic diepoxide of formula (XIX).

According to yet another aspect, the present invention relates to the polymerization under irradiation of a monomer, oligomer or polymer of formula (I) or of formula (II). This is because, on account of the existence of free epoxy functional groups in the $R_2$ group of these compounds, the latter lend themselves well to polymerization under irradiation, for which polymerization they show a particular aptitude at high rates, and to providing coatings with superior performances as regards in particular durability, porosity, resistance to chemical attacks (such as due to solvents, detergents, cleaners and pickling agents) and surface appearance.

These surprising results are obtained by polymerizing under irradiation a composition comprising at least one monomer, oligomer or polymer of formula (I) or of formula (II) in the presence of at least one cationic polymerization photoinitiator and, if appropriate, in the presence of another compound which is cationically polymerizable in the presence of this photoinitiator.

Numerous families of compounds which are known as cationic photoinitiators can be used for the polymerization process according to the invention. Mention may be made, among these compounds, of aromatic diazonium salts of complex halides, such as, in particular, 2,4-dichlorobenzenediazonium tetrachloroferrate(III), p-nitrobenzenediazonium tetrachloroferrate(III), p-morpholinobenzenediazonium tetrachloroferrate(III), 2,4-dichlorobenzenediazonium hexachlorostannate(IV), p-nitrobenzenediazonium hexachlorostannate(IV), 2,4-dichlorobenzenediazonium tetrafluoroborate, p-chlorobenzenediazonium hexafluorophosphate, 2,4-dichlorobenzenediazonium hexafluorophosphate, 2,4,6-trichlorobenzenediazonium hexafluorophosphate, 2,4,6-tribromobenzenediazonium hexafluorophosphate, p-nitrobenzenediazonium hexafluorophosphate, o-nitrobenzenediazonium hexafluorophosphate, 4-nitro-o-toluenediazonium hexafluorophosphate, 2-nitro-p-toluenediazonium hexafluorophosphate and 6-nitro-2,4-xylenediazonium hexafluorophosphate.

Mention may also be made of complex salts of aromatic iodonium of formula

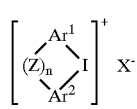

(XXXV)

in which

Ar, and $Ar_2$ are different or identical aromatic groups having from 4 to 20 carbon atoms, such as phenyl, thienyl, furanyl and pyrazolyl. The Ar, and $Ar_2$ groups can, if appropriate, possess one or more fused benzo nuclei, for example naphthyl, benzothienyl, dibenzothienyl, benzofuranyl or dibenzofuranyl, and/or one or more substituents, such as halogen, nitro, hydroxyl, carboxyl, anilino, N-alkylanilino, ester, sulphoester, amido, carbamoyl, sulphanyl, alkoxy, alkyl, aryl, aryloxy, arylsulphonyl or perfluoroalkyl, Z is chosen from oxygen and sulphur atoms, the carbon-carbon bond, sulphone, carboxyl, sulphoxide and amine groups, and groups of formula (XXXVI)

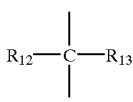

(XXXVI)

in which
R$_{12}$ and R$_{13}$ are chosen from the hydrogen atom, alkyl radicals comprising from 1 to 4 carbon atoms and alkenyl radicals comprising from 2 to 4 carbon atoms,
n is equal to 0 or 1,
X$^-$ is a halogenated complex anion chosen from tetrafluoroborate, hexafluoroborate, hexafluoroarsenate, hexachloroantimonate and hexafluoroantimonate.

Examples of such iodonium salts are in particular diphenyliodonium, di(4-methylphenyl)iodonium, phenyl-(4-methylphenyl)iodonium, di(4-heptylphenyl)iodonium, di(naphthyl)iodonium, di(4-phenoxyphenyl)iodonium tetrafluoroborate phenyl-(2-thienyl)iodonium, and 2,2'-diphenyliodonium tetrafluoroborates; di(3-nitrophenyl)iodonium, di(4-chlorophenyl)iodonium, di(4-trifluoromethyl-phenyl)iodonium tetrafluoroborate diphenyliodonium, di(2,4-dichlorophenyl)iodonium, di(4-bromophenyl)iodonium, di(4-methoxyphenyl)iodonium, di(3-carboxyphenyl)iodonium, di(3-methoxycarbonylphenyl)iodonium, di(3-methoxysulphonylphenyl)iodonium, di(4-acetamidophenyl)iodonium and di(2-benzothienyl)iodonium hexafluorophosphates; di(4-methylphenyl)iodoniuim hexafluorophosphate diphenyliodonium hexafluoroarsenate; and 3,5dimethyliodonium hexafluoroantimonate.

Mention may also be made, as usable cationic photoinitiators, of onium borates in which the cationic part comprises an onium salt, as disclosed in Patents U.S. Pat. Nos. 4,026,705, 4,032,673, 4,069,056, 4,136,102 and 4,173,476, or else an oxoisothiochromanium salt, as disclosed in Patent Application WO-A-90/11303, or alternatively an organometallic salt, as disclosed in Patents U.S. Pat. No. 4,973,722 and 4,992,572 and in Patent Applications EP-A-203,829, EP-A-323,584 and EP-A-354,181, in which the anionic borate part has the formula

(XXXVII)

in which a and b are integers ranging from 0 to 4 with a+b=4; each X is a halogen atom with a=0 to 3 or an OH functional group with a=0 to 2; and the R symbols, which can be identical or different, are each:
  a phenyl radical substituted by at least one electron-withdrawing group or by at least two halogen atoms when the cationic part is an onium salt of an element from groups 15 to 17 of the Periodic Table (Chem. & Eng. News, vol. 63, No. 5, 26), or else
  a phenyl radical substituted by at least one electron-withdrawing group or one halogen atom when the cationic part is an organometallic salt of a metal from groups 4 to 10 of the Periodic Table, or else
  an aryl radical comprising at least two aromatic rings, if appropriate substituted by at least one electron-withdrawing group or one halogen atom, whatever the cationic part.

Mention may particularly be made, as examples of such compounds, of tetrakis(penta fluoropheny)) borates of diphenyliodonium, (4-octyloxyphenyl)-phenyliodonium, (dodecylphenyl)iodonium, ($\eta^5$-cyclopentadienyl) ($\eta^6$-cumene)Fe$^+$, ($\eta^5$-cyclopentadienyl)($\eta^6$-toluene)-Fe$^+$ and ($\eta^5$-cyclopentadienyl)($\eta^6$-methylnaphthalene)Fe$^+$.

Mention may also be made, as usable cationic photoinitiators, of complex salts of aromatic sulphonium, such as those of formula (XXXVIII)

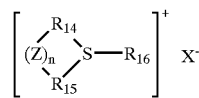

(XXXVIII)

in which
R$_{14}$, R$_{15}$ and R$_{16}$ are identical or different and are chosen from aromatic groups having from 4 to 20 carbon atoms (as defined above for Ar$_1$ and Ar$_2$) and alkyl groups having from 1 to 20 carbon atoms, provided that at least one of R$_{14}$, R$_{15}$ and R$_{16}$ is aromatic,
Z is defined as in the formula (XXXVI)
n has the value 0 or 1, and
X$^-$ is a halogenated complex anion chosen from tetrafluoroborate, hexafluorophosphate, hexafluoroarsenate, hexachloroantimonate and hexafluoroantimonate.

Mention may in particular be made, as examples of these salts, triphenylsulphonium, methyldiphenylsulphonium, 4-butoxyphenyldiphenylsulphonium, 4-acetoxyphenyldiphenylsulphonium, di(methoxynaphthyl)methylsulphonium, 4-acetamidophenyldiphenylsulphonium, trifluorodiphenylsulphonium, 10-phenyl-9-oxothioxanthenium and 5-methyl-10-oxothianthrenium tetrafluoroborates; dimethylphenylsulphonium, triphenylsulphonium, tritolylsulphonium, tris(4-phenoxyphenyl)sulphonium, tris(4-thiomethoxyphenyl)sulphonium, di(carbomethoxyphenyl)methylsulphonium, dimethylnaphthylsulphonium, phenylmethylbenzylsulphonium, 10-methylphenoxathiinium, 10-phenyl-9,9-dimethylthioxanthenium, 10-phenylthioxanthenium, 5-methylthianthrenium and 5-methyl-10, 10-dioxothianthrenium hexafluorophosphates; triphenylsulphonium, anisyldiphenylsulphonium, 4-chlorophenyldiphenylsulphonium, di(methoxysulphonylphenyl)methylsulphonium and methy-N-methylphenothiazinium hexafluoroantimonates; and dimethylnaphthylsulphonium and di(4-ethoxyphenyl) methylsulphonium hexafluoroarsenates.

Mention may also be made, as usable cationic photoinitiators, of onium salts from group VIa of general formula (XXXIX):

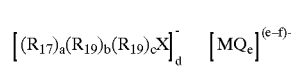

(XXXIX)

in which:
R$_{17}$ is a monovalent aromatic group having from 6 to 13 carbon atoms, if appropriate substituted,
R$_{18}$ is a monovalent aliphatic group having from 1 to 8 carbon atoms chosen from alkyl, cycloalkyl and substituted alkyl groups, $R_{19}$ is a polyvalent organic group forming a structure which is heterocyclic or comprising condensed rings, which structure is chosen from aliphatic or aromatic groups, X is chosen from sulphur, selenium and tellurium, M is a metal or semimetal, Q is a halogen, a is an integer ranging from 0 to 3, b has a value of between 0 and 2, c has the value 0 or 1, the sum of a+b+c is equal to 3 or else to the valency of X d=e−f f has the value of a valency of M and is an integer ranging from 2 to 7, e is greater than f and is an integer ranging up to 8.

M can be a transition metal, such as antimony, iron, tin, bismuth, aluminium, gallium, indium, titanium, zirconium, scandium, vanadium, chromium, manganese and caesium, a rare earth metal, such as a lanthanide (for example cerium) or an actinide (such as thorium or uranium), or a semimetal, such as boron, phosphorus and arsenic. The complex anions $[MQ_e]^{(e-f)-}$ are, for example, $BF_4^-$, $PF_6^-$, $AsF_3^-$, $SbF_6^-$, $FeCl_4^-$, $SnCl_6^-$, $SbCl_6^-$, $BiCl_5^{--}$, $AlF_6^{3-}$, $TiF_6^{--}$ and $ZrF_6^-$.

Another family of usable cationic photoinitiators is composed of aromatic complex salts of transition metals of general formula (XL):

  (XL)

in which:

M is a transition metal chosen from antimony, iron, tin, bismuth, aluminium, titanium, zirconium, vanadium, chromium, manganese and caesium, $Ar_1$ and $Ar_2$ are groups defined as in the formula (XXXV), and X is a halogenated complex anion chosen from $BF_4^-$, $PF_6^-$, $AsF_3^-$, $SbF_6^-$, $FeCl_4^-$, $SnCl_6^-$, $SbCl_6^-$, $BiCl_5^{--}$, $AlF_6^{3-}$, $TiF_6^{--}$ and $ZrF_6^-$.

Mention may in particular be made, as examples of such compounds, of ($\eta^5$-2,4-cyclopentadien-1-yl)-[(1,2,3,4,5,6-$\eta$)-(1-methylethyl)benzene]iron(1+) hexafluorophosphate (1−) of formula (XLI):

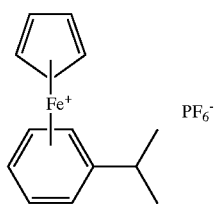  (XLI)

Another family of usable cationic photoinitiators is composed of the compounds of formula (XLII):

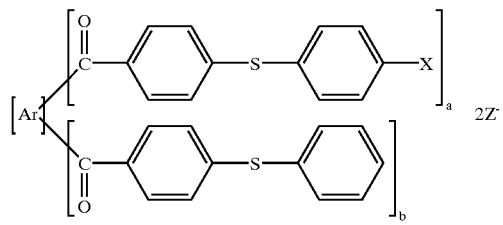  (XLII)

in which

Ar is an aromatic group, such as phenyl, biphenyl or naphthyl, if appropriate substituted, X is a bisphenylsulphonio group of formula

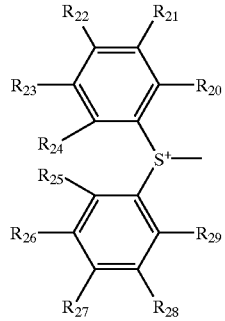  (XLIII)

in which $R_{20}$ to $R_{29}$ is each independently chosen from hydrogen and halogen atoms or nitro, alkoxy, alkyl, phenyl, phenoxy, alkylthio, phenylthio, benzyloxy and hydroalkyl groups, a is a number from 1 to 4, b is a number from 0 to 3, a+b is a number from 1 to 4 and n is a number from 1 to 4, and Z is a halide of formula $MQ_m(OH)_l$   (XLIV)

in which M is chosen from boron, phosphorus, arsenic and antimony atoms, Q is a halogen, m is a number from 3 to 6. l is 0 or 1 and m+l is a number from 4 to 6.

As indicated above, the polymerization under irradiation of the compound of formula (I) or (II) can be carried out in the presence of another compound cationically polymerizable by means of the same photoinitiator; that is to say, in this case, the process according to the invention consists in polymerizing under irradiation a mixture comprising, on the one hand, (A) a compound of formula (I) or (II) and, on the other hand, (B) such another compound. In order to retain the outstanding advantages introduced with respect to the rate of polymerization and the performances of the polymerized products obtained, it is preferable for such a mixture to comprise at least 20% by weight of the compound (A) and thus at most 80% by weight of the compound (B).

Various categories of compounds (B) may be suitable for the polymerization under irradiation of such a composition. Their determination depends essentially, on the one hand, on their ability to be polymerized under irradiation in the presence of the chosen cationic photo-initiator and, on the other hand, on their miscibility with the compound (A) of formula (I) or (II) used. Mention may thus be made, as non-exhaustive examples of such compounds (B), of:

non-cycloaliphatic monoepoxides, for example mono- or multifunctional aliphatic monoepoxides, such as, in particular, glycidyl, 2-(norborn-2-yloxy)ethyl, 2-(dimethanodecahydronaphth-2-yloxy) ethyl, 4,5-epoxypentyl, 5,6-epoxyhexyl, 6,7-epoxyheptyl, 7,8-epoxyoctyl, 8,9-epoxynonyl, 9,10-epoxydecyl, 11,12-epoxydodecyl, 2,3-epoxybutyl, 3-phenyl-2,3-epoxypropyl and octahydro-2,5-methano-2H-undeno-[1,2-b]oxyrenyl acrylates and methacrylates, mono- or multifunctional cycloaliphatic monoepoxides, such as 5(6)-hydroxy-2-[2,1'-epoxyethyl]-bicyclo[2.2.1]heptane, 3,4-epoxycyclohexylmethyl, 2-(1,2-epoxy-4,7-methanoperhydroinden-5(6)-yloxy)-ethyl, 5,6-epoxy-4,7-methanoperhydroinden-2-yl, 1,2-epoxy-4,7-methanoperhydroinden-5-yl, 2,3-epoxycyclopentenylmethyl and 3,4-epoxycyclohexylmethylated polycaprolactone acrylates and methacrylates, the 3,4-epoxycyclohexylmethylated polycaprolactone having the formula:

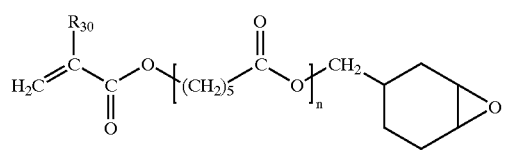

(XLV)

in which $R_{30}$ is chosen from hydrogen and a methyl radical and n is an integer ranging from 1 to 10 approximately, the 4-vinylcyclohexene monoepoxide of formula

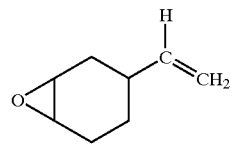

(XLVI)

the vinylnorbornene monoepoxide of formula

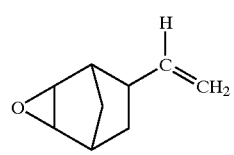

(XLVII)

the limonene monoepoxide of formula

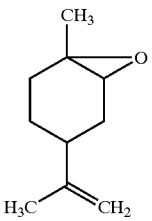

(XLVIII)

and limonene diepoxide of formula

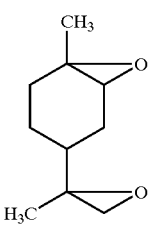

(XLIX)

aliphatic diepoxides, such as diglycidyl ethers of polyhydric alcohols of general formula

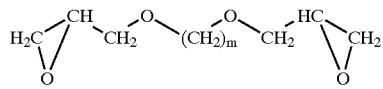

(L)

in which m is an integer ranging from 2 to 12, in particular 1,4-butanediol diglycidyl ether (1,4-bis-2,3-epoxypropoxy)butane) or diethylene glycol diglycidyl ether (bis[2-(2,3-epoxypropoxy)ethyl]ether) of formula

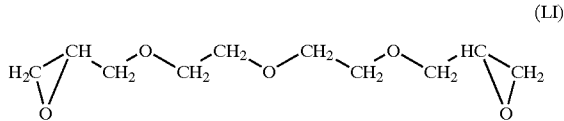

(LI)

as well as 2,3-bis(2,3-epoxypropoxy)-1-propanol and 1,3-bis(2,3-epoxypropoxy)-2-propanol, polyglycidyl ethers of polyhydric phenols possessing at least one aromatic nucleus and their adducts with an alkylene oxide, for example those produced by the reaction of bisphenol compounds, such as bisphenol A, bisphenol F and bisphenol S or their ethylene oxide, propylene oxide or butylene oxide adducts, with epichlorohydrin, epoxy resins of novolak, cresol-novolak or bromophenol-novolak type, and the triglycidyl ether of triphenolmethane. General structures of these polyepoxidized resins are represented in particular by the formulae

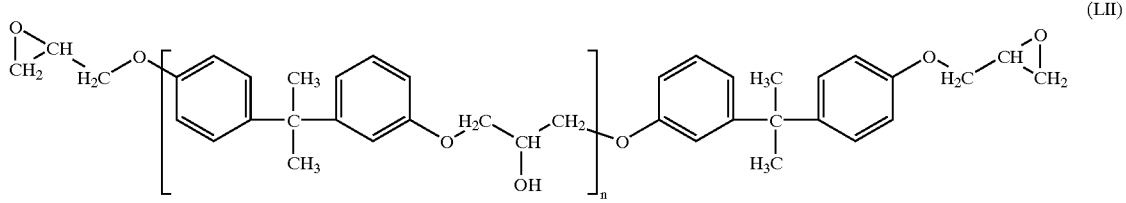
(LII)

(for bisphenol A derivatives), and

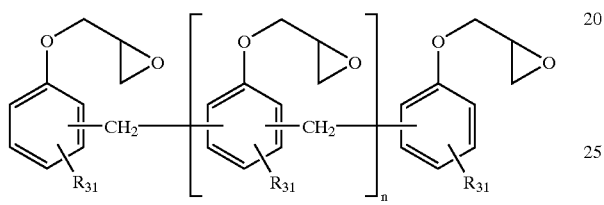
(LIII)

in which $R_{31}$ is chosen from hydrogen and a methyl group (for novolac epoxy-phenol and epoxy-cresol resins), aromatic and heterocyclic glycidylated amino resins, such as resins derived from the tetraglycidyl-methylenedianiline of formula

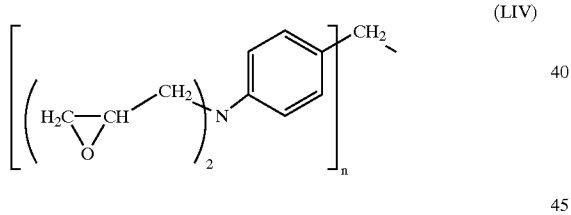
(LIV)

resins derived from triglycidyl-p-aminophenol, triazine-based resins and epoxy-hydantoin resins of formula

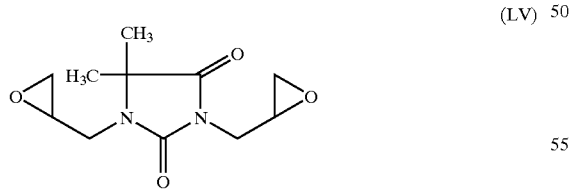
(LV)

adducts of alicyclic epoxy alcohols and of (meth)acryloyl isocyanate or of isocyanatoethyl (meth)acrylate or of m-isopropenyl-α,α-dimethylbenzyl isocyanate, such as N-(3,4-epoxycyclohexyl)-methoxycarbonyl(meth) acrylamide, N-(5,6-epoxy-4,7-methanoperhydroinden-2-yl)oxycarbonyl(meth)acrylamide and the adduct of 3,4-epoxycyclohexylmethylated polycaprolactone and of (meth)acryloyl isocyanate of formula

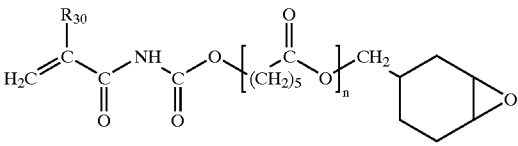
(LVI)

in which $R_{30}$ is chosen from hydrogen and the methyl radical and n is. an integer ranging from 1 to 10, epoxidized derivatives of unsaturated natural compounds, such as, for example, epoxidized soybean oils, and of unsaturated synthetic polymers, such as epoxidized polybutadiene, aliphatic vinyl ethers, such as triethylene glycol divinyl ether and hydroxybutyl vinyl ether, cyclic vinyl ethers, such as 1,4-cyclohexanedimethanol divinyl ether, acrolein oligomers, 4-methyldihydropyran and derivatives of 3,4-dihydropyran-2-methanol, and alkyl vinyl ethers, propenyl ethers, such as the propenyl ether of propylene carbonate and compounds of formula $$A(OCH=CHCH_3)_n \quad \text{(LVII)}$$

in which n is an integer ranging from 1 to 6 and A is chosen from cyclic ethers, polyethers and linear, branched or cyclic alkanes possessing from 2 to 20 carbon atoms. Examples of such compounds comprise: 1,2-dipropenoxyethane, 1,4-dipropenoxybutane, 1,6-propenoxyhexane, 1,3-dipropenoxypropane, 1,4-cyclohexanedimethanol dipropenyl ether, 1,4-cyclohexane dipropenyl ether, 1,2-dipropenoxypropane, 1,10-dipropenoxydecane, 1,8-dipropenoxyoctane, 1,2,3-tripropenoxypropane, 1,2,3,4-tetrapropenoxybutane, sorbitol hexapropenyl ether, trimethylolpropane tripropenyl ether, pentaerythritol tetrapropenyl ether, 1,2-dipropenoxycyclopentane, 1,3-dipropenoxyperfluoropropane, diethylene glycol dipropenyl ether, tetraethylene glycol dipropenyl ether and 3,4-dipropenoxytetrahydrofuran, oxetanes, such as 3,3-bis(chloromethyl)oxetane, 4,4-dialkyl-2-alkoxyoxetanes, compounds of formula

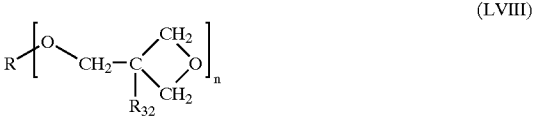
(LVIII)

in which R is an arylene group (for example a phenylene group), $R_{32}$ is chosen from hydrogen and methyl and ethyl radicals, and n is an integer at least equal to 2, and substituted oxetanes, such as those disclosed in Patent U.S. Pat. No. 5,463,084.

The amount of cationic photoinitiator to be used for the implementation of the process for polymerization by irradiation is to be related to the amount of polymerizable organic material, that is to say to the combined weight of the compound (A) of formula (I) or (II) and of the compound (2) optionally mixed with the latter. A conventional proportion of photoinitiator(s) is between approximately 0.1% and approximately 10% by weight of the polymerizable organic material, preferably from approximately 1% to 5% by weight of the said material.

According to a specific aspect of the present invention, the composition subjected to polymerization under irradiation can additionally comprise at least one monomer or oligomer compound, such as a urethane-acrylate, a polyester-acrylate or an epoxy-acrylate, capable of curing under irradiation by a duel or hybrid crosslinking mechanism. In this case, two different crosslinking mechanisms take place either simultaneously or successively: by way of example, mention may be made of compounds capable of curing by radical polymerization. In the case where the cationic photoinitiator is an aromatic sulphonium salt, a radical initiator is unnecessary because the photoinitiator at the same time supplies cations and free radicals during its decomposition. Alternatively, it is possible to employ the combination of a cationic photoinitiator as described above and of a radical initiator, such as, for example, benzophenone, benzyl dimethyl acetal, cyclohexyl phenyl ketone, thioxanthones and any other initiator used to cause radical polymerization. The respective proportions of the two initiators to be used and their total amount will vary as a function of the formulation of the composition and of the application envisaged.

In addition, for certain specific uses of the polymerized products obtained by the irradiation process according to the invention, it can be useful to add, to the polymerizable composition comprising the compounds (A) and (B), at least one hydroxylated compound capable of lowering the viscosity of the composition (for example ethanol) and/or at least one polyhydroxylated compound or one aldehyde capable of acting as chain-transfer agent or capable of rendering the polymerizable composition flexible. Mention may in particular be made, among the latter compounds, of ethylene glycol, 1,4-butanediol, benzaldehyde, pentaerythritol, trimethylolpropane and oligomers comprising hydroxyl endings, such as polyesterpolyols, polyetherpolyols, hydroxylatedpolycaprolactones and hydroxylated polybutadienes.

For the implementation of the polymerization process according to the invention, any normal method for curing by actinic radiation can be resorted to. The radiation can be ionizing (corpuscular or non-corpuscular) or non-ionizing radiation. Any source which emits electrons or charged nuclei can be employed as appropriate source of corpuscular radiation. Corpuscular radiation can be generated, for example, by electron accelerators (under voltage conditions of 50 to 500 KeV approximately and irradiation conditions of 1 to 10 megarads), such as a Van der Graff accelerator, and radioactive elements, such as cobalt-60, strontium-90 and the like. Any source which emits radiation in the region from $10^{-3}$ to 2000 angstroms can be employed as appropriate source of non-ionizing non-corpuscular radiation. The appropriate sources include ultraviolet radiation vacuum lamps, such as xenon or krypton arcs. Any source which emits radiation from approximately 150 nm to approximately 500 nm can be employed as appropriate source of non-ionizing radiation. The appropriate sources include mercury arcs, carbon arcs, tungsten filament lamps, ultraviolet radiation lamps, excimer lamps and lasers providing an energy preferably from 100 to 1000 $mJ/cm^2$ approximately.

When the radiation-curable coating compositions have to be cured by exposure to non-ionizing radiation, for example ultraviolet radiation, a photoinitiator or photoactivator other than the cationic photoinitiator described above can be added to the composition. Well-known examples include 2,2-diethoxyacetophenone, 2-, 3- or 4-bromoacetophenone, benzaldehyde, benzoin, benzophenone, 9,10-dibromoanthracene, 4,4'-dichlorobenzophenone, 2,3-pentanedione, hydroxycyclohexyl phenyl ketone and (thio)xanthones. Such photoinitiators are generally added in amounts ranging from 0.1% to 10% approximately by weight and preferably from 1% to 5% by weight on the basis of the weight of the polymerizable composition.

According to yet another specific aspect of the present invention, the composition can also polymerize according to the so-called "crosslinking in darkness" mechanism. In this case, in contrast to the polymerization initiated by free radicals, the polymerization continues after exposure to radiation has ceased. This mechanism can be of use in certain cases, for example for improving the crosslinking in the pores of porous substrates, for adhesives, coatings for electronics, and the like.

The composition subjected to the irradiation process according to the invention can, in addition to the compound (A) and, if appropriate, the compound (B), the chain-transfer or flexibilization agent, the additional photoinitiator (in the case of ultraviolet radiation) and the photoactivator, comprise:

at least one wetting or surface-modifying agent capable of improving the spreading properties of the polymer film, such as a silicone or fluorinated product or a polyether or any other compound known for contributing this specific property, at least one adhesion promoter known per se, at least one inorganic filler (such as, in particular, kaolin, silica, barium sulphate, calcium carbonate or talc) or organic filler commonly used in coating compositions which can be crosslinked under radiation, at least one inorganic pigment, which is or is not in the form of paste in an organic polymer binder, or organic colorant, and if appropriate, one or more additives chosen from the categories of antistatic agents, antifoaming agents, wetting agents and thickening agents.

The various optional additives listed above will be used in the context of the present invention in proportions already well known in irradiation coating techniques.

The resin compositions used in the irradiation polymerization process according to the invention can be applied in the form of a coating on a support by any method, such as coating with a brush, coating by spraying, coating by the curtain-coating technique, and the like. If appropriate and depending on the requirements of the specific application envisaged, the support can be subjected to a treatment stage prior or subsequent to the irradiation, such as a heat treatment intended to accelerate or to complete the polymerization reaction of the composition. In the latter case, the temperature and the duration of the heat post-treatment will be chosen in a way dependent on the nature of the support under consideration: the post-treatment temperature will generally be between approximately 50° C. and approximately 300° C., preferably between 70° C. and 150° C. approximately, the duration of post-treatment generally being between a few seconds and 24 hours approximately.

According to another aspect, the present invention also relates to a support coated with at least one layer of polymerized composition obtained by the irradiation process described above. This support can be highly varied in nature, in particular wood, metals, such as steel and aluminium, plastics, such as polyolefins, polycarbonates, saturated and unsaturated polyesters, phenol and phenol-formaldehyde resins, polyamides, poly(vinyl chloride), copolymers of ethylene and of acrylic monomers, polymethacrylates, and the like.

Due to their adhesion to highly varied supports, the polymerized compositions based on monomers, oligomers or polymers of formula (I) or of formula (II) can find a great many industrial applications, such as:

- thin, thick or semi-thick coatings on all the above-mentioned supports,
- pressure-sensitive adhesives, in particular for the manufacture of self-adhesive films, in particular based on plasticized poly(vinyl chloride), on polyethylene, on polypropylene, on poly(ethylene terephthalate) or on paper; in this application, it will be preferable to resort-to a monomer, oligomer or polymer of formula (II) for which the $A_2$ block derives essentially from an acrylic monomer,
- transparent varnishes,
- foams for cars or films for labels made of vinyl chloride,
- laminating adhesives for laminating two identical or different layers of material,
- stereolithography, in particular for three-dimensional objects,
- printing inks, in particular for the graphic arts.

The following examples illustrate the invention in more detail. The parts and the percentages are by weight, except when otherwise indicated.

EXAMPLE 1

A polyester comprising carboxyl endings is prepared by heating a mixture of diethylene glycol and of an excess of adipic acid at 220° C. under a nitrogen atmosphere in the presence of 0.2% of butyltin tris(2-ethylhexanoate) (sold by the company M&T Chemicals Inc. under the name Fascat 4102) while distilling off water until a molecular weight of 1000 and an acid number, measured according to ASTM Standard D 974-64, of 118 mg KOH/g are obtained.

A mixture of 262 g of 3,4-epoxycyclohexylmethyl-3,4-epoxycyclohexane (sold by Daicel Chemical Industries under the name Celloxide 2021 P) and of 231 g of toluene is heated to reflux (120° C.) in a reactor, to which is slowly added, over one hour, a mixture of 200 g of polyester comprising carboxyl endings prepared above, as well as 65 g of toluene and 0.1% of a catalyst, sold by the company Aerojet Solid Propulsion Company under the name AMC-2, composed of 5.1% of chromium 2-ethylhexanoate in a matrix of orthophthalic esters of $C_7$–$C_{11}$ alcohols. Stirring is continued in the reactor at 120° C. until the acid number falls to 4 mg KOH/g. The mixture is then cooled to 80° C. and the toluene is distilled off under high vacuum.

The reaction product is subsequently analysed by gel permeation chromatography by using:

- instrument: Merck-Hitachi L 6000 high-pressure pump equipped with a Merck-Hitachi AS 2000 automatic injector;
- column: 2×PL gel 3 µm Mixed E 300×7.5 mm at a temperature of 40° C.;
- detecter: Waters RI 401 differential refractometer;
- eluent: stabilized tetrahydrofuran;
- flow rate: 1 ml/minute;
- volume injected: 100 µl;
- data processing: GPC/SEC grade PL software;
- calibration: polystyrene standard and Celloxide 2021 P.

This analysis makes it possible to determine that the reaction product is composed of 28% unreacted Celloxide 2021 P and 72%; polyester comprising epoxycycloaliphatic endings according to the invention. Furthermore, the epoxy equivalent, determined according to the method of M. Chakrabarty, Analyst, 95, page 85, (1970), of the reaction product is 309 g.

EXAMPLE 2

A polyester comprising carboxyl endings is prepared as in Example 1 but by continuing the reaction up to a molecular weight of 2000 and an acid number of 57 mg KOH/g.

This polyester is then reacted with the diepoxide Celloxide 2021 P as in the preceding example, with the exception of the amounts of polyester (412 g) and of toluene (338 g to dissolve the diepoxide, 112 g to dissolve the catalyst and the polyester).

The final product, analysed as in the preceding example, has an epoxy equivalent of 438 g and is composed of 78% polyester comprising epoxycycloaliphatic endings according to the invention and 22% unreacted Celloxide 2021 P.

In addition, the reaction product is analysed by:

- Fourier transform infra-red spectroscopy by means of a Perkin-Elmer 1760 instrument, the spectra being recorded in the form of films on a thallium bromoiodide crystal (KRS-5) at a resolution of 4 $cm^{-1}$. These spectra are characterized by absorptions at 3512 $cm^{-1}$ (OH band), 1734 $cm^{-1}$ (C=O band of the ester functional group), 1255, 1176 and 1136 $cm^{-1}$ (C—0 band of the ester functional group).
- proton nuclear magnetic resonance at a frequency of 60 MHz, using $CDCl_3$ as solvent and tetramethylsilane as reference. The resulting spectrum shows chemical shifts of 1.63 ppm (adipic acid and cycloaliphatic $CH_2$), 2.32 ppm (adipic acid $CH_2$), 3.0 ppm (epoxy), 3.6 ppm (ether $CH_2$), 4.15 ppm (ester $CH_2$) and 4.7 ppm (ester CH).

EXAMPLE 3

A mixture of 262 g (1 mol) of 3,4-epoxycyclohexylmethyl-3,4-epoxycyclohexane Celloxide 2021 P, 0.1% of the AMC-2 catalyst and 195 g of toluene is heated to 115° C. in a reactor. 30.7 g (0.21 mol) of adipic acid are added portionwise to this solution over one hour. Stirring is continued at 115° C. until the acid number has fallen to 1 mg KOH/g. After cooling to 80° C. and distilling off the toluene under high vacuum, the final product is collected and analysed as in the preceding example. It has an epoxy equivalent of 189 g and proves to be composed of 51% diacid comprising epoxycycloaliphatic endings according to the invention and of 49% unreacted Celloxide 2021 P.

EXAMPLE 4

A mixture of 0.75 mol of isophorone diisocyanate, 0.38 mol of dihydroxymethylpropionic acid and 200 ppm of trinonylphenylphosphine is slowly heated to 50° C. After the exothermic peak, this mixture is stirred at 75° C. for 3 hours. When the reaction is complete, a further addition of 0.75 mol of poly(propylene glycol), sold by Shell under the name PPG 1025, and 250 ppm of dibutyltin dilaurate is carried out, stirring is continued for 9 hours at 85° C. and the polyurethane obtained is then filtered off.

262 g of Celloxide 2021 P, 0.1% of the AMC-2 catalyst and 667 g of toluene are heated to 105° C. in a reactor. A solution of 1606 g of the polyurethane obtained above (having an acid number of 17 mg KOH/g) and of 0.1% of the catalyst in 260 g of toluene is slowly added to this mixture over one hour. Stirring is continued at 115° C. until the acid number has fallen to 4 mg KOH/g and then, after cooling to 80° C., the toluene is distilled off under high vacuum. The final product, analysed as in the preceding example, has an epoxy equivalent of 1136 g and is composed of 93% polyurethane comprising epoxycycloaliphatic endings according to the invention and 7% unreacted Celloxide 2021 P.

EXAMPLE 5

A solution of a mixture of 500 g of methyl acrylate, of 500 g of n-butyl methacrylate, of 25 g of mercaptopropionic acid and of 2 g of 2,2'-azobis-(2-methylbutyronitrile) initiator in 666 g of toluene is first of all prepared.

A quarter of this solution is introduced into a reactor and is heated to reflux and then, after the exothermic peak, the remaining three-quarters are slowly added over 90 minutes. The copolymer solution is then stirred at 120° C. for 4 hours and 2 g of initiator are added portionwise every 30 minutes. The reaction mixture is then cooled.

A mixture of 158 g of Celloxide 2021 P and of 352 g of toluene is heated to reflux in another reactor. A 0.1% solution of the AMC-2 catalyst in the acrylic copolymer solution prepared above is subsequently added slowly to the mixture over one hour. Stirring is continued at 115° C. until the acid number has decreased to 2 mg KOH/g. After cooling to 80° C. and distilling off the toluene under high vacuum, the final product is collected and then analysed as in the preceding example. Its epoxy equivalent is 1225 g and it proves to be composed of 92% polyacrylate comprising epoxycycloaliphatic endings according to the invention and of 8% unreacted Celloxide 2021 P.

EXAMPLE 6

The procedure of Example 1 is repeated, with the exception of the preparation of the polyester, for which polyester the diethylene glycol is replaced in a proportion of 16% by trimethylolpropane, and continuing the reaction to a molecular weight of 2000 and an acid number of 87.4 mg KOH/g.

The final product, analysed as in Example 1, has an epoxy equivalent of 380 g and is composed of 79% polyester comprising epoxycycloaliphatic endings according to the invention and 21% unreacted Celloxide 2021 P.

EXAMPLE 7

A polyester comprising carboxyl endings is prepared as in Example 2 but continuing the reaction to a molecular weight of 3000 and an acid number of 39.2 mg KOH/g.

This polyester is subsequently reacted with the diepoxide Celloxide 2021 P as in the preceding example, with the exception of the amounts of polyester (627 g) and of toluene (444 g to dissolve the diepoxide, 148 g to dissolve the catalyst and the polyester).

The final product, analysed as in Example 1, has an epoxy equivalent of 568 g and is composed of 83% polyester comprising epoxycycloaliphatic endings according to the invention and of 17% unreacted Celloxide 2021 P.

EXAMPLE 8

The procedure of Example 2 is repeated, with the exception of the complete replacement of the diethylene glycol by an equivalent molar amount of butanediol and continuing the reaction to a molecular weight of 2000 and an acid number of 70.1 mg KOH/g.

The final product, analysed as in Example 1, has an epoxy equivalent of 405 g and is composed of 78% polyester comprising epoxycycloaliphatic endings according to the invention and of 22% unreacted Celloxide 2021 P.

EXAMPLE 9

The procedure of Example 3 is repeated, with the exception of the complete replacement of the adipic acid by an equivalent molar amount of azelaic acid.

The final product, analysed as in Example 1, has an epoxy equivalent of 198 g and is composed of 54% diacid comprising epoxycycloaliphatic endings according to the invention and of 46% unreacted Celloxide 2021 P.

EXAMPLE 10

The procedure of Example 3 is repeated, with the exception of the complete replacement of the adipic acid by an equivalent molar amount of decanedicarboxylic acid.

The final product, analysed as in Example 1, has an epoxy equivalent of 201 g and is composed of 54% diacid comprising epoxycycloaliphatic endings according to the invention and of 46% unreacted Celloxide 2021 P.

EXAMPLE 11

The procedure of Example 3 is repeated, with the exception of the complete replacement of the adipic acid by an equivalent molar amount of succinic acid.

The final product, analysed as in Example 1, has an epoxy equivalent of 187 g and is composed of 52% polyester comprising epoxycycloaliphatic endings according to the invention and of 48% unreacted Celloxide 2021 P.

EXAMPLE 12

The procedure of Example 3 is repeated, with the exception of the complete replacement of the adipic acid by an equivalent molar amount of lauric acid.

The final product, analysed as in Example 1, has an epoxy equivalent of 232 g and is composed of 63% monoacid comprising an epoxycycloaliphatic ending according to the invention and of 37% unreacted Celloxide 2021 P.

EXAMPLE 13

The procedure of Example 3 is repeated, with the exception of the complete replacement of the adipic acid by an equivalent molar amount of terephthalic acid.

The final product, analysed as in Example 1, has an epoxy equivalent of 196 g and is composed of 55% diacid comprising epoxycycloaliphatic endings according to the invention and of 45% unreacted Celloxide 2021 P.

EXAMPLE 14

The procedure of Example 5 is repeated, apart from the following two exceptions:

in the first stage, the initiator used is 4,4'-azobis(4-cyanovaleric acid), sold by the company Wako Pure Chemical Industries under the name Vazo 501.

in the final stage (other reactor), 185 g of Celloxide 2021 P and 388 g of toluene are employed.

The final product, analysed as in Example 1, has an epoxy equivalent of 1067 g and proves to be composed of 91% polyacrylate comprising epoxycycloaliphatic endings according to the invention and of 9% unreacted Celloxide 2021 P.

EXAMPLE 15

A mixture of 262 g of Celloxide 2021 P, 292 g (2 mol) of adipic acid, 0.1% of AMC-2 catalyst and 892 g of toluene is heated at 115° C. in a reactor. Stirring is continued until the acid number has fallen to 78 mg KOH/g. 786 g (3 mol) of Celloxide 2021 P are then added in a single step and stirring is continued until the acid number has fallen to 1 mg KOH/g. After cooling to 80° C. and distilling off the toluene under high vacuum, the final product is collected and analysed as in the preceding examples. It has an epoxy equivalent of 341 g and proves to be composed of 80% diacid comprising epoxycycloaliphatic endings according to the invention and of 20% unreacted Celloxide 2021 P.

EXAMPLE 16

Various properties of crosslinked formulations, starting from products obtained in the preceding examples, were tested on films with a thickness of 10 μm, prepared manually by means of a spiral film drawer, on various substrates.

Each formulation tested comprises 70 parts of Celloxide 2021 P, 30 parts of the product comprising epoxycycloaliphatic endings (according to the invention) from a preceding example and 3 parts by weight of a cationic photoinitiator sold by the company Minnesota Mining and Manufacturing under the name FX-512 composed of 60% triphenylsulphonium hexafluorophosphate and of 40% γ-butyrolactone.

The properties determined are as follows:
reactivities of the formulation, measured by its rate of crosslinking RC (expressed in meters per minute and defined as the rate of forward progression under an ultraviolet radiation lamp with a power of 80 W/cm allowing a film to be obtained which is finger dry (evaluation to the touch by an operator) and the rate at which particles of talc no longer adhere to the surface of the coating TR (expressed in meters per minute), resistances to solvents, measured after 24 hours by the resistance to acetone RA (expressed as number of two-fold rubbing movements by the acetone administered to the film until it detaches from the support), König hardness KH after approximately 24 hours, expressed in seconds and determined according to ASTM Standard D 4366, adhesion at 23° C., expressed in % and determined by the test of adhesion according to ASTM Standard D-3002 for various substrates: ALU (aluminium), PET (polyester), PVC (poly(vinyl chloride)), glass, PE (polyethylene) and PP (polypropylene).

The results of these various measurements are combined in the table below.

TABLE

| Product of Example | RC | TR | RA | KH | Adhesion | | | | | |
|---|---|---|---|---|---|---|---|---|---|---|
| | | | | | ALU | PET | PVC | PE | PP | Glass |
| 1 | >100 | >100 | 60 | 205 | 0 | 0 | 100 | 80 | nd | nd |
| 2 | >100 | >100 | >100 | 160 | 0 | 0 | 100 | 100 | 100 | nd |
| 3 | >100 | >100 | 20 | 226 | 100 | 100 | 100 | 90 | 100 | 100 |
| 5 | 30 | 20 | >100 | 191 | 100 | 0 | 100 | 100 | nd | nd |
| 6 | 80 | 75 | >100 | 185 | 100 | 100 | 100 | 50 | 100 | 100 |
| 7 | 80 | 70 | 65 | 175 | 100 | 100 | 100 | 100 | 90 | 100 |
| 8 | 60 | 55 | >100 | 180 | 0 | 100 | 100 | 100 | 100 | nd |
| 9 | 70 | 60 | 25 | 243 | 100 | 100 | 100 | 100 | 100 | 100 |
| 10 | 60 | 50 | 10 | 224 | 100 | 100 | 100 | 100 | 100 | 100 |
| 11 | >100 | >100 | 50 | 226 | 100 | 100 | 100 | 100 | 100 | 100 |
| 12 | 40 | 30 | 75 | 165 | 100 | 100 | 100 | 100 | 100 | 100 |
| 13 | 45 | 40 | 9 | 187 | 100 | 100 | 100 | 100 | 50 | 100 |
| 15 | 50 | 40 | >100 | nd | 100 | 100 | 100 | 100 | 100 | nd |
| Pure Celloxide | 100 | 100 | 5 | 203 | 100 | 0 | 100 | 80 | 100 | 100 | nd = not determined

The results of the corresponding measurements carried out on the Celloxide 2021 P starting material also appear in this table, by way of comparison. These results show, for crosslinked compositions comprising only 30% by weight of the polymer comprising epoxycycloaliphatic endings according to the invention, a very great improvement in the resistance to solvents (RA), which is obtained while maintaining a satisfactory rate of crosslinking and while maintaining or improving adhesion to various substrates.

What is claimed is:
1. A monomer, oligomer or polymer of formula (I) or (II); where: formula (I) is denoted by

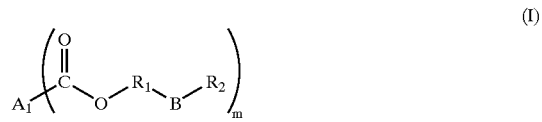

in which:
$A_1$ is selected from the group consisting of:
polyester blocks having a molecular weight of between 250 and 10,000;
polyurethane blocks having a molecular weight of between 500 and 5000;
hydrocarbon-comprising back-bones of a mono- or polycarboxylic acid; and
addition products of a polycarboxylic acid and of a cyclo-aliphatic diepoxide;
m is a number from 1 to 6, $R_1$ is a cycloaliphatic group carrying a hydroxyl group situated in the α position with respect to the oxygen atom to which $R_1$ is bonded and where $R_1$ may be further substituted or unsubstituted;

$R_2$ is a second cycloaliphatic group carrying an oxirane group situated at the chain end and where $R_2$ may be further substituted or unsubstituted; and B is selected from the group consisting of:
  one or more covalent bonds;
  on oxygen atom;
  linear, branched or cyclic hydrocarbon-comprising radicals which may be unsubstituted or substituted by one or more oxygen and/or silicon atoms; and formula (II) is denoted by:

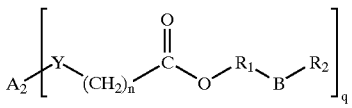

(II)

in which:
  $A_2$ is a block selected from the group consisting of:
    homopolymers and copolymers of at least one vinyl monomer;
  n is an integer from 0 to 15, with the condition that n is at least equal to 1 when Y is sulphur;
  Y is selected from the group consisting of:
    a sulphur atom;
    —CR'R" radicals, in which R' and R" are each an aliphatic group having from 1 to 4 carbon atoms; and
    mixtures thereof;
  q is an integer or non-integer ranging from about 1 to about 2; and
  $R_1$, B and $R_2$ are defined as in the above formula (I).

2. A monomer, oligomer or polymer according to claim 1, wherein $R_1$ and $R_2$ are cycloaliphatic groups with a ring having from 5 to 6 members which can carry one or more hydrocarbon-comprising substituents which are not very sterically hindered.

3. A monomer, oligomer or polymer according to claim 2, wherein said ring carries one or more hydrocarbon-comprising substituents are not sterically hindered.

4. A monomer, oligomer or polymer according to claim 1, wherein B is a radical selected from the group consisting of:

—$(CH_2)_n$— alkylene groups in which n is an integer from 1 to 12;

a —CH═CH— group;

a group of formula (VI)

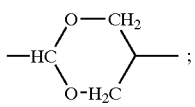

(VI)

a group of formula (VII)

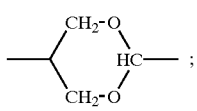

(VII)

a group of formula (VIII)

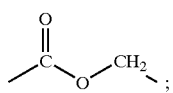

(VIII)

a group of formula (IX)

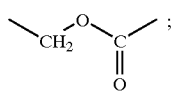

(IX)

a group of formula (X)

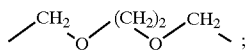

(X)

a group of formula (XI)

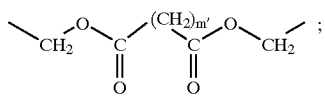

(XI)

in which m' is an integer from 0 to about 20;

a group of formula (XII)

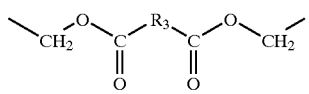

(XII)

in which $R_3$ is a cycloaliphatic radical which may carry an oxirane group;

a group of formula (XIII)

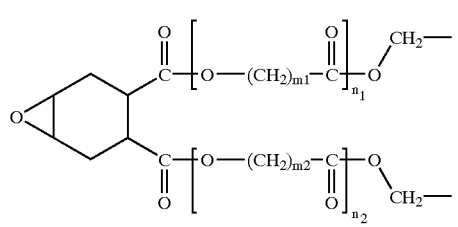

(XIII)

in which
$m_1$ and $m_2$ are each an integer from 1 to about 6; and
$n_1$ and $n_2$ are each an integer from 0 to 2;

a group of formula (XIV)

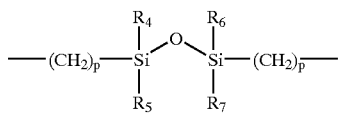

(XIV)

in which
p is an integer from about 1 to about 10; and
$R_4$, $R_5$, $R_6$ and $R_7$ are each selected independently from the group consisting of alkyl radicals having from 1 to 4 carbon atoms;

a group of formula (XV)

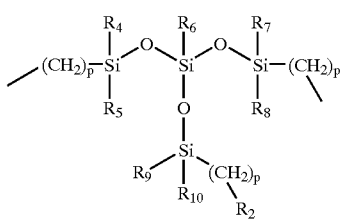
(XV)

in which p is an integer from about 1 to about 10;

$R_4$, $R_5$, $R_7$, $R_8$, $R_9$ and $R_{10}$ are each selected independently from the group consisting of alkyl radicals having from 1 to 4 carbon atoms, $R_6$ is selected from the group consisting of alkyl radicals having from 1 to 4 carbon atoms and aryl radicals having from 6 to 9 carbon atoms, and $R_2$ has the same meaning as in the above formula (I); and a group of formula (XVI)

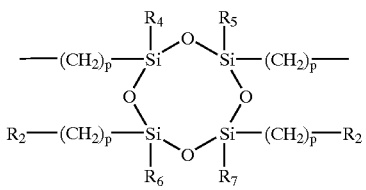
(XVI)

in which $R_4$, $R_5$, $R_6$ and $R_7$ are each selected independently from the group consisting of alkyl radicals having from 1 to 4 carbon atoms, p is an integer from about 1 to about 20; and $R_2$ has the same meaning as in the above formula (I).

5. A monomer, oligomer or polymer according to claim 4, wherein B is a group of formula (XI) and m' in formula (XI) is from about 1 to 6.

6. A monomer, oligomer or polymer according to claim 4, wherein B is a group of formula (XIV) and p in formula (XIV) is from about 1 to about 3.

7. A monomer, oligomer or polymer according to claim 4, wherein B is a group of formula (XIV) and $R_4$, $R_5$, $R_6$ and $R_7$ in formula (XIV) are methyl.

8. A monomer, oligomer or polymer according to claim 4, wherein B is a group of formula (XV) and p in formula (XV) is from about 1 to about 3.

9. A monomer, oligomer or polymer according to claim 4, wherein B is a group of formula (XV) and $R_4$, $R_5$, $R_7$, $R_8$, $R_9$ and $R_{10}$ in formula (XV) are methyl.

10. A monomer, oligomer or polymer according to claim 4, wherein B is a group of formula (XV) and $R_6$ in formula (XV) is selected from the group consisting of methyl or phenyl.

11. A monomer, oligomer or polymer according to claim 4, wherein B is a group of formula (XVI) and p in formula (XVI) is from about 1 to about 6.

12. A monomer, oligomer or polymer according to claim 4, wherein B is a group of formula (XVI) and $R_4$, $R_5$, $R_6$, and $R_7$ in formula (XVI) are methyl radicals.

13. A monomer, oligomer or polymer according to claim 1, wherein $A_1$ is the hydrocarbon-comprising backbone of an acid selected from the group consisting of:

saturated aliphatic monoacids having from 4 to 40 carbon atoms;

saturated or unsaturated aliphatic diacids having from 4 to 40 carbon atoms;

aromatic diacids; and tricarboxylic acids.

14. A monomer, oligomer or polymer according to claim 1, wherein the vinyl monomer of the $A_2$ block is selected from the group consisting of:

acrylic esters;

methacrylic esters; and vinylaromatic monomers copolymerizable with acrylic or methacrylic esters.

15. Monomers, oligomers or polymers according to claim 1, where said monomers, oligomers or polymers are curable by radiation.

16. A process for the preparation of a monomer, oligomer or polymer according to claim 1, wherein it comprises the reaction of:

a cycloaliphatic diepoxide of general formula (XIX)

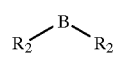
(XIX)

in which B and $R_2$ are as defined in the formulae (I) and (II), with (i) a monomer or polymer compound of formula (XVII)

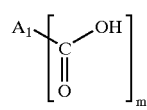
(XVII)

in which $A_1$ and m are as defined in the formula (I); to obtain a compound of formula (I), or (ii) a monomer or polymer compound of formula (XVIII)

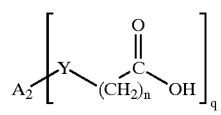
(XVIII)

in which $A_2$, Y, q and n are as defined in the formula (II); to obtain a compound of formula (II):

where the molar ratio of the diepoxide (XIX) to the monomer or polymer of formula (XVII) or (XVIII) is selected to maintain at least one epoxide functional group of the epoxide (XIX) available for subsequent reaction.

17. The process according to claim 16, wherein the amounts of each reactant are selected to maintain at least two epoxy equivalents per one carboxylic acid equivalent.

18. The process according to claim 16, wherein the reaction is carried out in the presence of at least one solvent.

19. The process according to claim 16, wherein the reaction is carried out at a temperature ranging from about 100° C. to about 150° C.

20. The process according to claim 16, wherein the reaction is carried out in the presence of a catalytic amount of a compound that promotes the reaction between the epoxide functional group and the carboxylic acid functional group.

21. The process according to claim 20, wherein the said catalytic compound is selected from the group consisting of:
trivalent chromium chlorides;
trivalent chromium tricarboxylates,
quaternary ammonium halides; and
ferric chloride.

22. The process according to claim 20, wherein the catalytic compound is employed in a proportion ranging up to 0.2% by weight with respect to the sum of the monomer or polymer of formula (XVII) or (XVIII) and of the cycloaliphatic diepoxide of formula (XIX).

23. A process for the polymerization of a composition comprising at least one monomer, oligomer or polymer according to claim 1 comprising the step of: irradiating said at least one monomer, oligomer or polymer according to claim 1 with ionising radiation in the presence of at least one cationic polymerization photoinitiator and, optionally, in the presence of another compound which is cationically polymerizable in the presence of said photoinitiator.

24. The process for polymerization according to claim 23, wherein said cationic polymerization photoinitiator is selected from the group consisting of:
aromatic diazonium salts of complex halides,
complex salts of aromatic iodonium,
complex salts of aromatic sulphonium, onium salts from group VIa; and
aromatic complex salts of transition metals.

25. The process for polymerization according to claim 23, wherein the cationically polymerizable compound is selected from the group consisting of:
monoepoxides which are cycloaliphatic or non-cycloaliphatic;
mono- or multifunctional, aliphatic diepoxides;
polyglycidyl ethers of polyhydric phenols;
aromatic and heterocyclic glycidylated amino resins;
resins derived from triglycidyl-p-aminophenol;
triazine-based resins;
epoxy-hydantoin resins;
adducts of alicyclic epoxy alcohols and of (meth)acryloyl isocyanates;
epoxidized derivatives of unsaturated natural compounds and of unsaturated synthetic polymers;
aliphatic and cyclic vinyl ethers;
alkyl vinyl ethers;
propenyl ethers; and
oxetanes.

26. The process for polymerization according to claim 23, wherein the second cationically polymerizable compound is present in an amount up to 80% by weight of the composition to be polymerized.

27. The process for polymerization according to claim 23, wherein the cationic photoinitiator is present in a proportion of 0.1% to 10% by weight of the polymerizable organic material.

28. The process for polymerization according to claim 23, wherein said ionising irradiation is ultraviolet radiation.

29. The process for polymerization according to claim 23, wherein the composition additionally comprises a photoinitiator other than the cationic photoinitiator.

30. The process for polymerization according to claim 23, wherein the composition additionally comprises at least one additive selected from the group consisting of:
photoactivators,
wetting or surface-modifying agents,
adhesion promoters,
inorganic or organic fillers,
inorganic pigments,
organic colorants,
antistatic agents,
antifoaming agents and
thickening agents.

31. The process for polymerization according to claim 23, wherein the ionising radiation is an electron beam.

32. The process according to claim 23, wherein said irradiating step is carried out in the presence of a second compound that is cationically polymerisable in the presence of said photo-initiator.

* * * * *

UNITED STATES PATENT AND TRADEMARK OFFICE
CERTIFICATE OF CORRECTION

PATENT NO. : 6,417,243 B1
DATED : July 9, 2002
INVENTOR(S) : Peeters et al.

It is certified that error appears in the above-identified patent and that said Letters Patent is hereby corrected as shown below:

<u>Title page,</u>
Item [57], ABSTRACT,
Line 14, "the a position" should read -- the α position --.

<u>Column 29,</u>
Line 10, "on oxygen atom;" should read -- an oxygen atom; and --.
Line 27, "from 0 to 15," should read -- from 0 to about 15, --.

Signed and Sealed this

Nineteenth Day of November, 2002

*Attest:*

*Attesting Officer*

JAMES E. ROGAN
*Director of the United States Patent and Trademark Office*